(12) United States Patent
Hayakawa

(10) Patent No.: US 6,439,910 B2
(45) Date of Patent: Aug. 27, 2002

(54) ROTATABLE GUIDE MEMBER FOR A SOCKET FOR ELECTRICAL PARTS

(75) Inventor: Kenji Hayakawa, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/880,853

(22) Filed: Jun. 15, 2001

(30) Foreign Application Priority Data

Jun. 19, 2000  (JP) .................................. 2000-183373

(51) Int. Cl.[7] ............................................... H01R 11/22
(52) U.S. Cl. ......................................... 439/266; 439/268
(58) Field of Search .............................. 439/266, 265, 439/264, 331, 330, 72, 68, 526, 268

(56) References Cited

U.S. PATENT DOCUMENTS 5,213,531 A * 5/1993 Matsuoka et al. .......... 439/331
5,669,780 A * 9/1997 Fukumaga .................. 439/266
6,280,218 B1 * 8/2001 Ohshima .................... 439/268

* cited by examiner

*Primary Examiner*—Tho D. Ta
*Assistant Examiner*—Phuong Nguyen
(74) *Attorney, Agent, or Firm*—Staas & Halsey LLP

(57) ABSTRACT

In a socket for electrical parts, a number of contact pins contacting a number of terminals of an electrical part are arranged, in grid shape, to a socket body in which the electrical part is accommodated, and a guide member is provided for the socket body for guiding a peripheral edge portion of the electrical part to a predetermined position of the socket body. The guide member is formed with an accommodation space into which the electrical part is guided and accommodated and has first and second mount positions apart by substantially 180° from each other, and the position of the accommodation space with respect to arrangement region of the contact pins on the side of the socket body is made variable by changing the mounting position of the guide member.

9 Claims, 17 Drawing Sheets

FIG.8A
FIG.8B
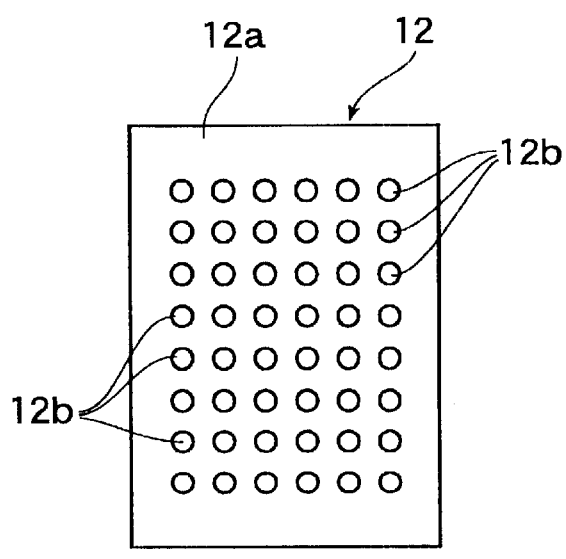
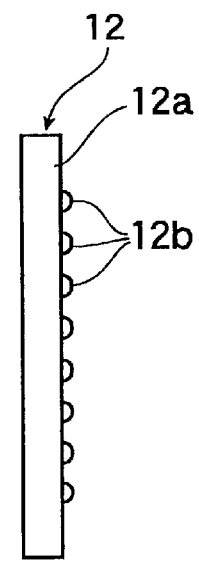

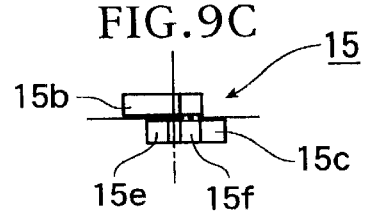
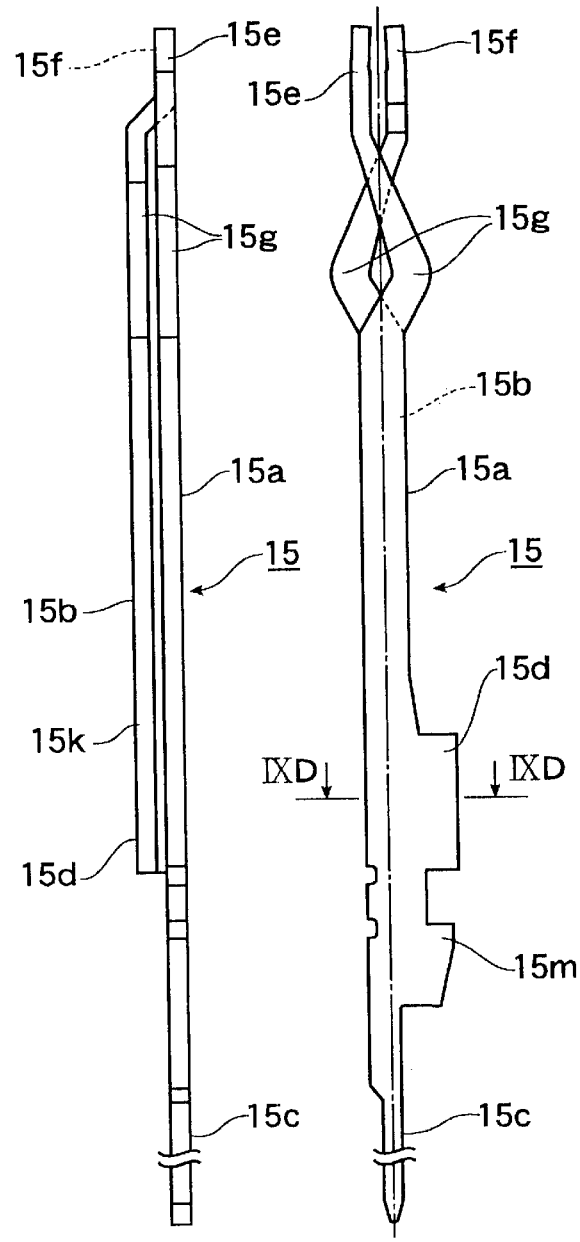

ROTATABLE GUIDE MEMBER FOR A SOCKET FOR ELECTRICAL PARTS

BACKGROUND OF THE INVENTION

The present invention relates to a socket for electrical parts for detachably accommodating and holding an electrical part such as a semiconductor device (called as "IC package" hereinlater), and more particularly, the present invention relates to a socket for electrical parts enabling the same guide member to be commonly used even in a case of different arrangement (row) numbers of terminals of the electrical part.

RELATED ART OF THE INVENTION

As a conventional "socket for electrical parts" of this kind, there is provided an IC socket for detachably accommodating an IC package as "electrical part".

The IC package includes, for example, a BGA (Ball Grid Array) type of IC package in which solder balls as a number of terminals are provided to the lower surface of the package body so as to protrude downward in a grid (lattice) arrangement having vertical (Y) and horizontal (X) rows.

The IC socket is provided with a socket body, a number of contact pins disposed to the socket body so as to contact the terminals of the IC package, respectively, and a guide member arranged to the socket body so as to guide the IC package to a predetermined position when the IC package is accommodated in the socket body. Furthermore, a movable member for contacting or separating the contact pins to or from the solder balls of the IC package, through elastic deformation of the contact pins, is also arranged to be vertically movable.

Furthermore, the socket body is provided with lever members to be rotatable (pivotal) about a pivotal shaft so as to vertically move the movable member, and an operation member for rotating the lever members is also provided for the socket body to be vertically movable. When this operation member is vertically moved, the lever members are rotated (pivoted), and according to this rotating motion, the movable member is vertically moved, thus contacting or separating contact portions of the contact pins, with deformation of the contact pins to or from the solder balls of the IC package.

However, in such conventional IC package as mentioned above, there are some cases of arrangements of different rows of terminals, i.e. solder balls. In order to treat such arrangements, different guide members have been prepared so as to be correspondingly mounted to the IC package, which requires a troublesome working of preparing a plurality of guide members corresponding to a plurality of IC packages having different rows of the terminal arrangements, thus being troublesome and inconvenient particularly for maintenance of parts.

SUMMARY OF THE INVENTION

An object of the present invention is to substantially eliminate defects or drawbacks encountered in the prior art mentioned above and to provide a socket for electrical parts capable of utilizing the same guide member even in the cases of using different numbers of arrangement rows of terminals of electrical parts.

This and other objects can be achieved according to the present invention by providing a socket for electrical parts in which a number of contact pins contacting a number of terminals of an electrical part are arranged in grid shape to a socket body in which the electrical part is accommodated and a guide member is provided for the socket body for guiding a peripheral edge portion of the electrical part to a predetermined position of the socket body, wherein the guide member is formed with an accommodation space into which the electrical part is guided and accommodated and has first and second mount positions different and apart by substantially 180° from each other, and the position of the accommodation space with respect to arrangement region of the contact pins on the side of the socket body is made variable by changing the mounting position of the guide member.

In a preferred embodiment, the guide member is mounted to a top plate of the socket body on which the electrical part is mounted. The socket body is further provided with an operation member to be vertically movable in an installed state and a movable member for displacing the contact pins in a manner that the movable member is moved through the vertical movement of the operation member and the contact pins are displaced through the movement of the movable member so as to be contacted to or separated from terminals of the electrical part. The guide member has a rectangular frame structure, the operation member has a rectangular frame structure, and the operation member is arranged to be vertically movable around the guide member.

The terminals of the electrical part are solder balls, and the socket is an IC socket and the electrical part is an IC package.

In a more structural aspect, the present invention provides a socket for electrical parts comprising:

a socket body to which an electrical part having a number of terminals are accommodated;

a number of contact pins arranged to the socket body so as to accord with the arrangement of the terminals of the electrical part;

an operation member disposed to the socket body to be vertically movable in an installed state;

a movable member disposed to the socket body to be movable in association with the movement of the operation member to thereby displace the contact pins so as to contact or separate the contact pins to or from the terminals of the electrical part; and a guide member disposed to the socket body for guiding a peripheral edge portion of the electrical part to a predetermined position of the socket body, the guide member being formed with an accommodation space into which the electrical part is guided and accommodated, the guide member having first and second mount positions different and apart by substantially 180° from each other, and the position of the accommodation space with respect to arrangement region of the contact pins on the side of the socket body is made variable by changing the mounting position of the guide member.

The guide member is provided for the socket body through a top plate having a mount surface through which the electrical part is mounted.

According to the present invention of the characters and structures mentioned above, the guide member has first and second mount positions different and apart by substantially 180° from each other, and the position of the accommodation space with respect to arrangement region of the contact pins on the side of the socket body is made variable by changing the mounting position of the guide member. Accordingly, the same guide member can be commonly utilized for electrical parts having different terminal arrangement (row) numbers, and therefore, constitutional elements or parts for the socket can be reduced and maintenance working can be hence made easy, eliminating troublesome operations and the like.

The nature and further characteristic features of the present invention will be made more clear from the following descriptions made with reference to the accompanying drawings.

BRIEF DESCRIPTION OF THE DRAWINGS

In the accompanying drawings:

FIG. 8A is a bottom view of an IC package of the IC socket of this embodiment and FIG. 8B is a left side view of the IC package;

FIG. 9 represents a contact pin of the IC socket of this embodiment and includes FIG. 9A being a front view, FIG. 9B being a left side view of FIG. 9A, FIG. 9C being a plan view of FIG. 9A and FIG. 9D being a sectional view taken along the line IXD—IXD of FIG. 9A;

DESCRIPTION OF THE PREFERRED EMBODIMENT

Figure 1:
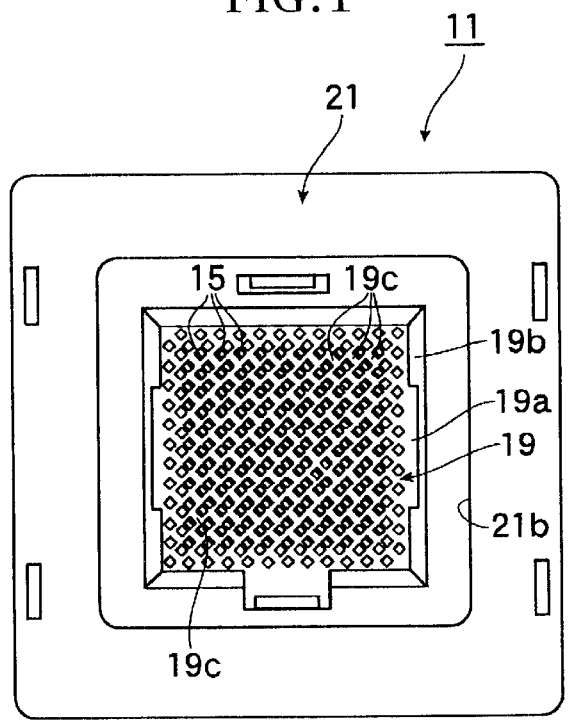
FIG. 1 is a plan view of an IC socket according to one embodiment of the present invention.

A preferred embodiment of the present invention will be described hereunder with reference to the accompanying drawings.

An IC socket as "socket for electrical parts" is totally designated by reference numeral 11, which is a device for carrying out an electrical connection between a solder ball 12b as "terminal" of an IC package 12 as "electrical part" and a printed circuit board, not shown, of a tester, for example, for a performance test of the IC package 12.

The IC package 12 is so-called a BGA (Ball Grid Array) type as shown in FIGS. 8A and 8B, in which a number of spherical-shape solder balls 12b are arranged to the lower surface of a rectangular package body 12a in a manner projecting in matrix arrangement of vertical and horizontal rows.

Figure 2:
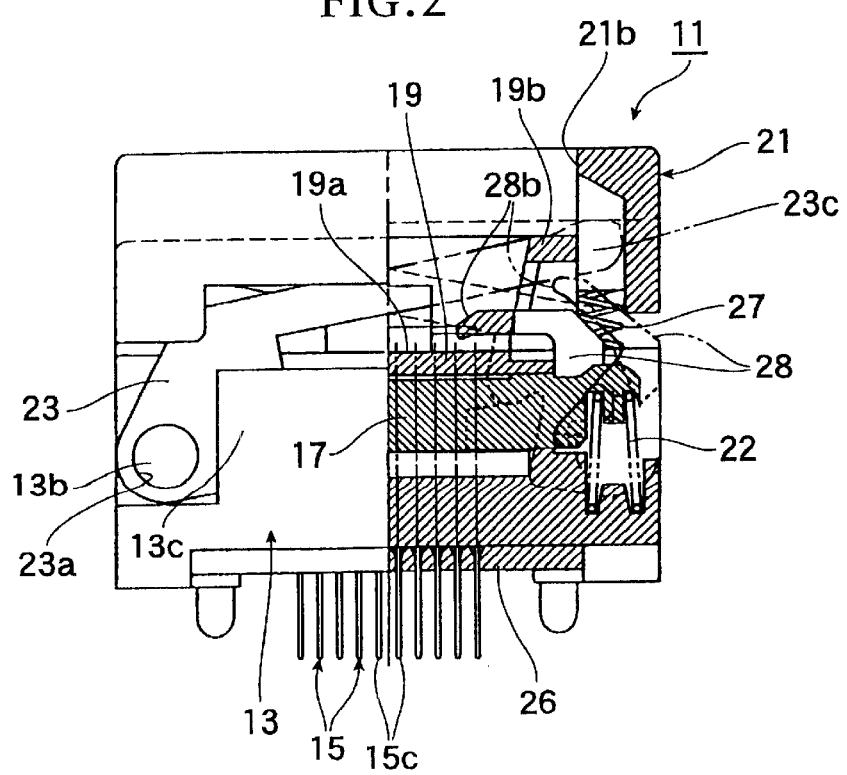
FIG. 2 is a front view of the IC socket of FIG. 1, in which a right half is shown as sectional view.

On the other hand, the IC socket 11 is generally composed of, as shown in FIG. 2, a socket body 13 formed of synthetic resin to be mounted on the printed circuit board. A number of contact pins 15, which are contacted to or separated from the solder balls 12b of the IC package 12, respectively, are provided for the socket body 13, and a movable member 17 for displacing the contact pins 15 is also provided for the socket body 13. In addition, a top plate 19 is further arranged and fixed to the socket body 13 at a position above the movable member 17. Furthermore, a guide member 20 is detachably mounted to the top plate 19 for guiding and arranging the IC package 12 to a predetermined position at a time of accommodating the IC package 12. An operation member 21 is further provided for the socket body 13 to be vertically movable so as to vertically move the movable member 17.

Each of the contact pins 15 is formed out of a plate member having a good conductivity and elastic (springy) property through a press working so as to provide a shape shown in FIG. 9 (FIGS. 9A to 9D).

More in detail, the contact pin 15 is composed of a pair of elastic pieces 15a and 15b at its upper portion and a solder tail portion 15c at its lower portion. The paired elastic pieces 15a and 15b have a common base portion 15d at lower portions thereof, as viewed in FIG. 9, and the base portion 15d has substantially a U-shape so that the paired elastic pieces 15a and 15b are opposed to each other. A pair of contact portions 15e and 15f are further formed to the upper (front end) portions of the respective elastic pieces 15a, 15b of each contact pin 15 so as to be contacted to or separated from the side portions of the solder balls 12b, and at a time when the solder ball 12b is clamped between the contact portions 15e and 15f, an electrical connection is established between the IC package 12 and the printed circuit board, not shown, for example.

Furthermore, each of the paired elastic pieces 15a and 15b of the contact pin 15 is formed with a bent portion 15g approximately in shape of "<", and these bent portions 15g are pressed by a cam portion (or cam portions) 17a, mentioned hereinlater, of the movable member 17 to thereby open the contact portions 15e and 15f.

Figure 3:
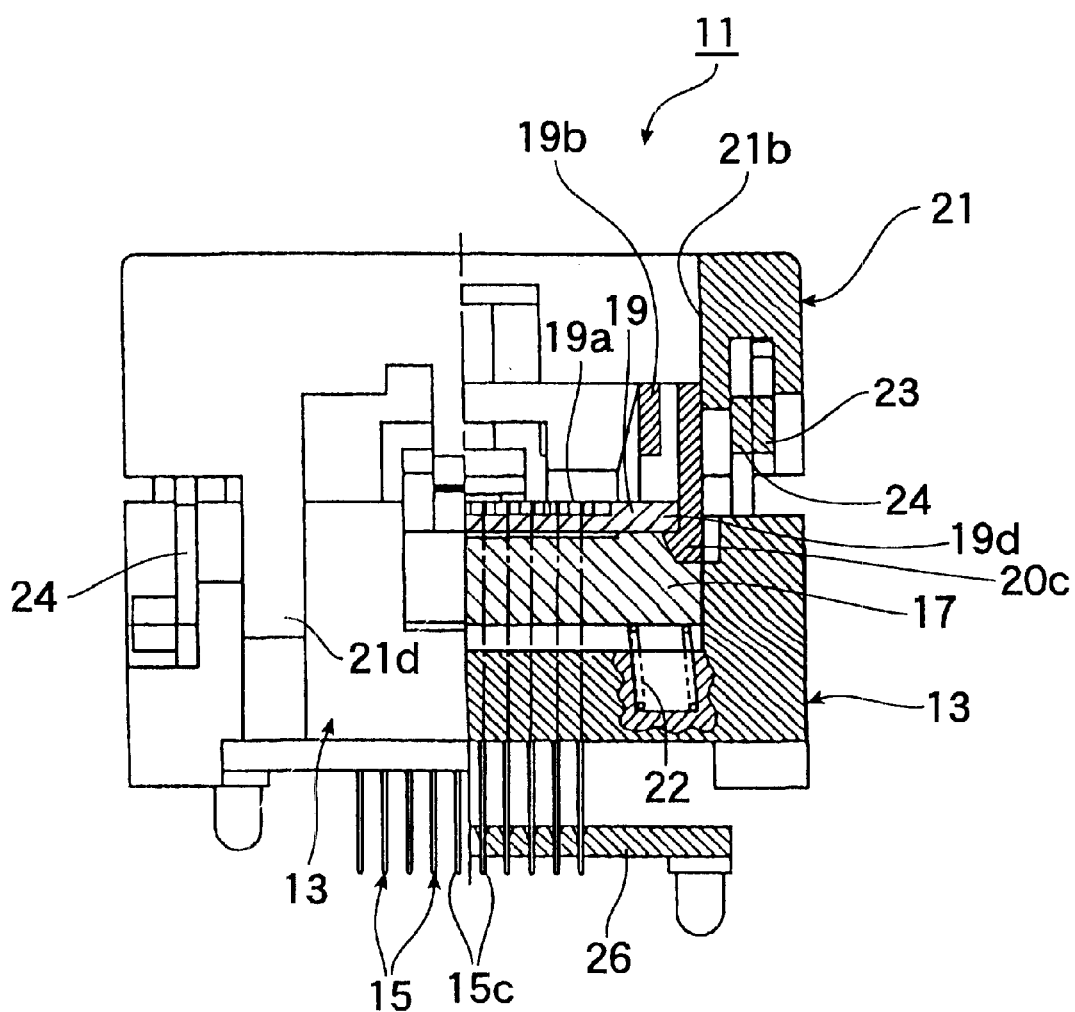
FIG. 3 is a side view of the IC socket of FIG. 1, in which a right half is shown as sectional view.
Figure 10:
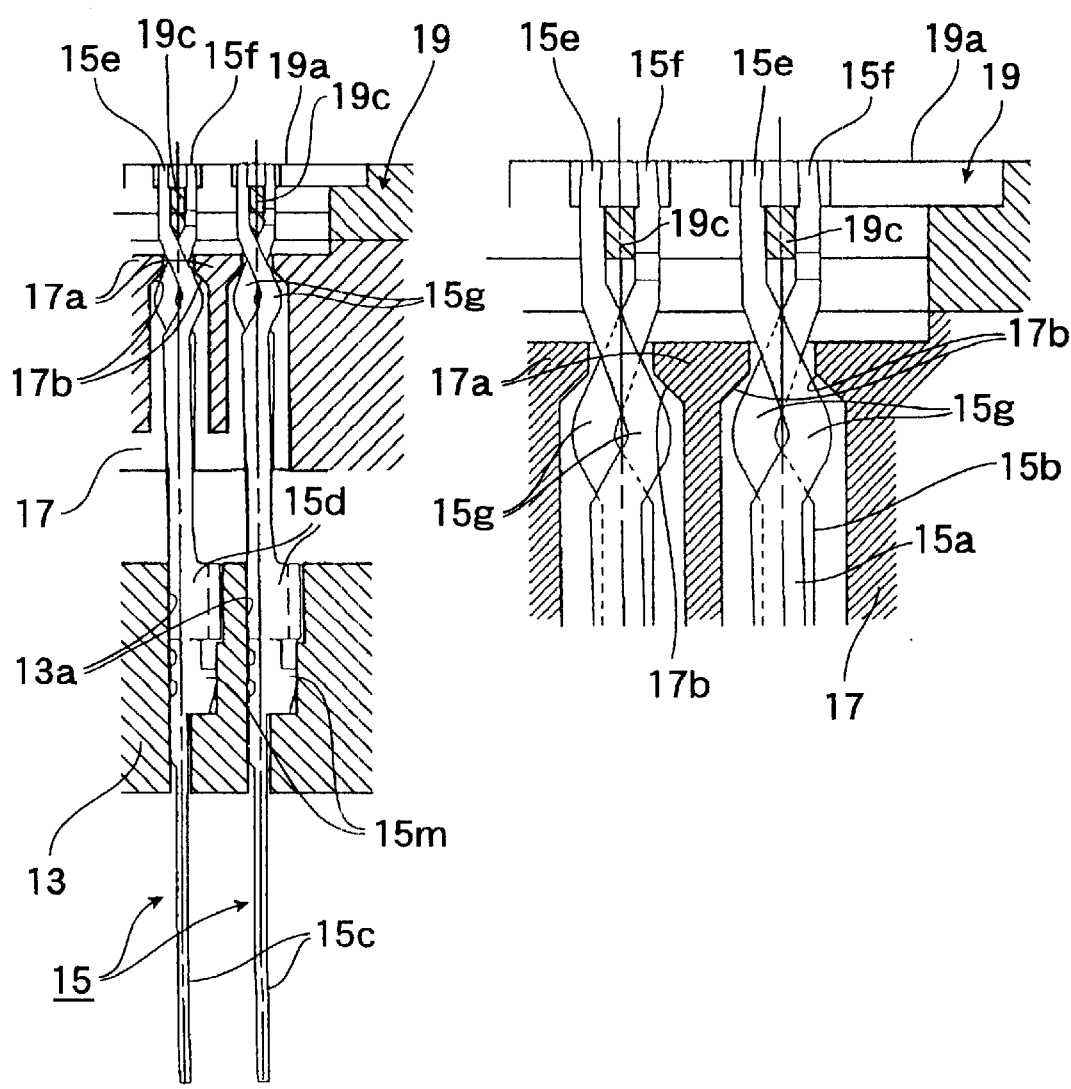
FIG. 10 is a sectional view of the contact pin in a closed state of its contact portion.
Figure 11:
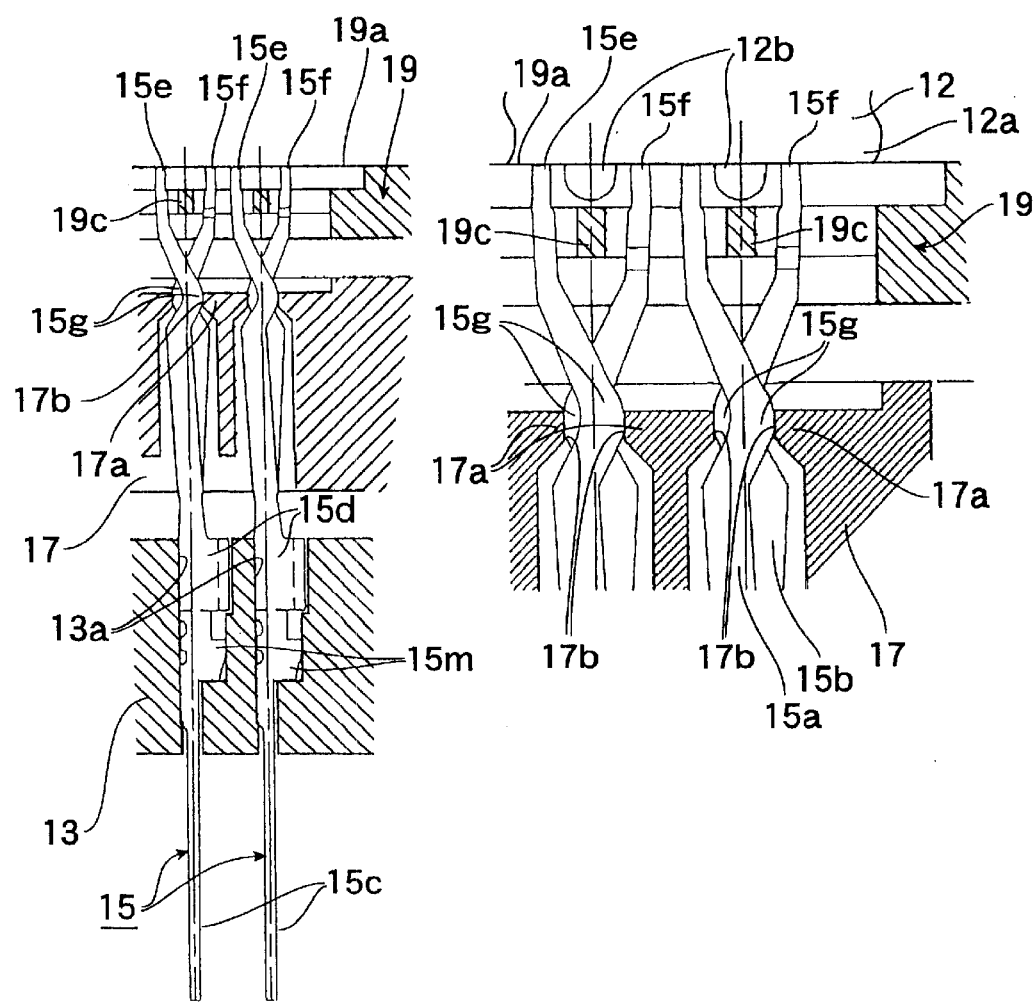
FIG. 11 is a sectional view of the contact pin in an opened state of its contact portion.

The solder tail portion 15c and the base portion 15d of the contact pin 15 of the structure mentioned above are press-fitted in a press-fit hole 13a formed to the socket body 13 as shown in FIGS. 10 and 11. Under the press-fitted state thereof, a falling prevention portion 15m formed to the base portion 15d bites the socket body 13 to thereby prevent the contact pin from falling out upward. The solder tail portion 15c projecting downward from the socket body 13 further extends downward through a location board 26 as shown in FIG. 2 or 3, and then, is inserted into a through hole formed to the printed circuit board and soldered thereto, thus being connected thereto.

These contact pins 15 are arranged in the lattice of vertical and horizontal rows with the same pitch as that of the arrangement of the solder balls 12b of the IC package 12.

Figure 5:
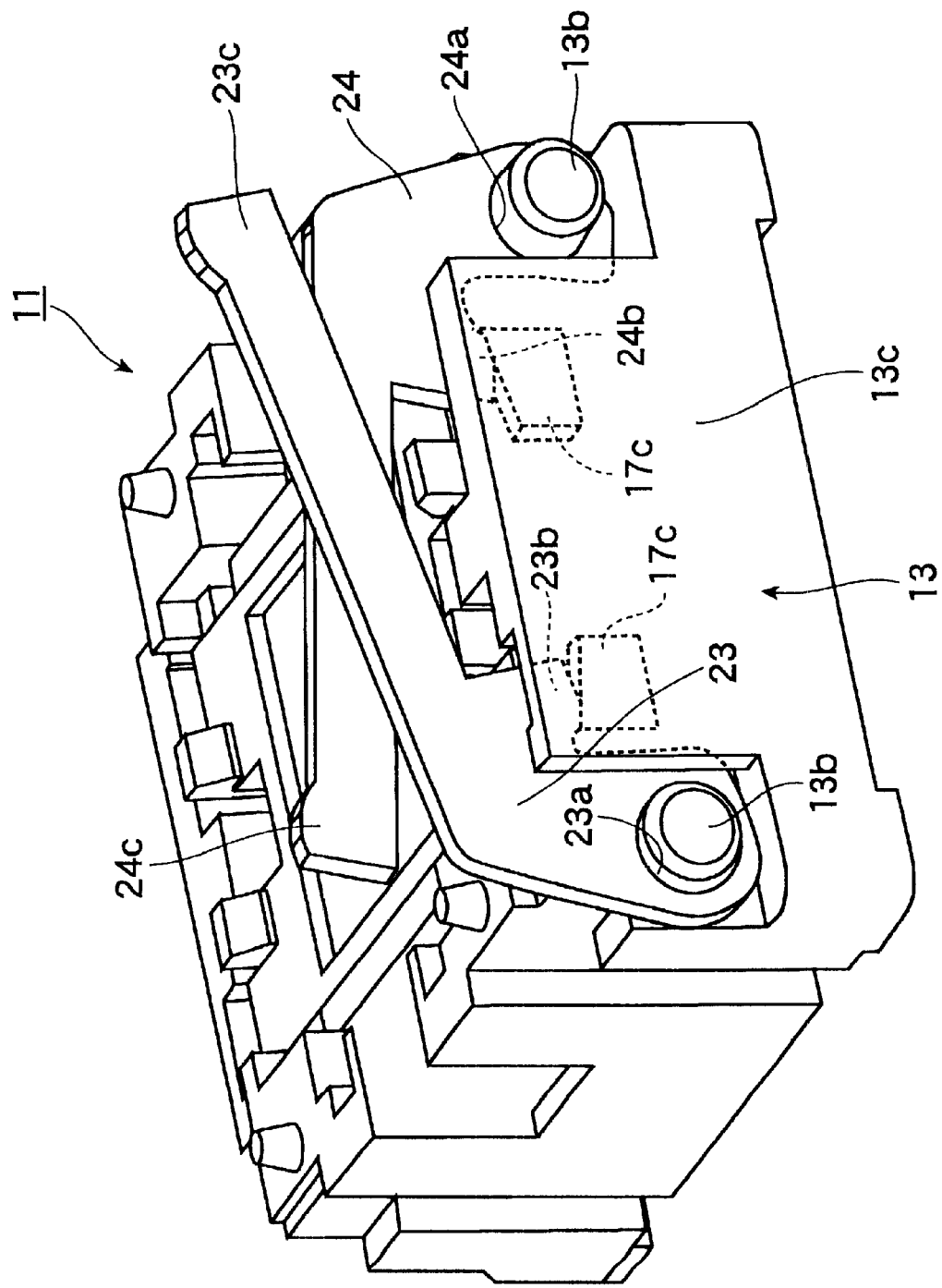
FIG. 5 is a perspective view of the IC socket of FIG. 4 with an operation member being removed.

On the other hand, the movable member 17 is disposed to the socket body 13 to be vertically movable with respect thereto, and that is, movable in a direction perpendicular to a mount surface 19a of the top plate 19 and urged upward by means of spring 22. Each set of first and second lever members (levers) 23 and 24 for vertically moving the movable member 17 is disposed on each lateral side of the movable member 17. In FIG. 5, only one set of the lever members 23 and 24 is described.

These first and second lever members 23 and 24 are made of metal and have base end portions to which fit-holes 23a and 24a are formed, and bosses 13b formed integrally with the synthetic resin made socket body 13 are fitted to these holes 23a and 24a to be rotatable. Both the lever members 23 and 24 are arranged in X-shape as shown in FIG. 5.

The base end sides of the first and second lever members 23 and 24 are formed with press portions 23b and 24b abutting against the upper surfaces of portions to be pressed 17c of the movable member 17 and depressing the surfaces downward. Furthermore, the socket body 13 is formed with guide walls 13c for guiding the side portions of the base end portions of the first and second lever members 23 and 24 so as to prevent both the levers 23 and 24 from coming off from the bosses 13b.

Figure 4:
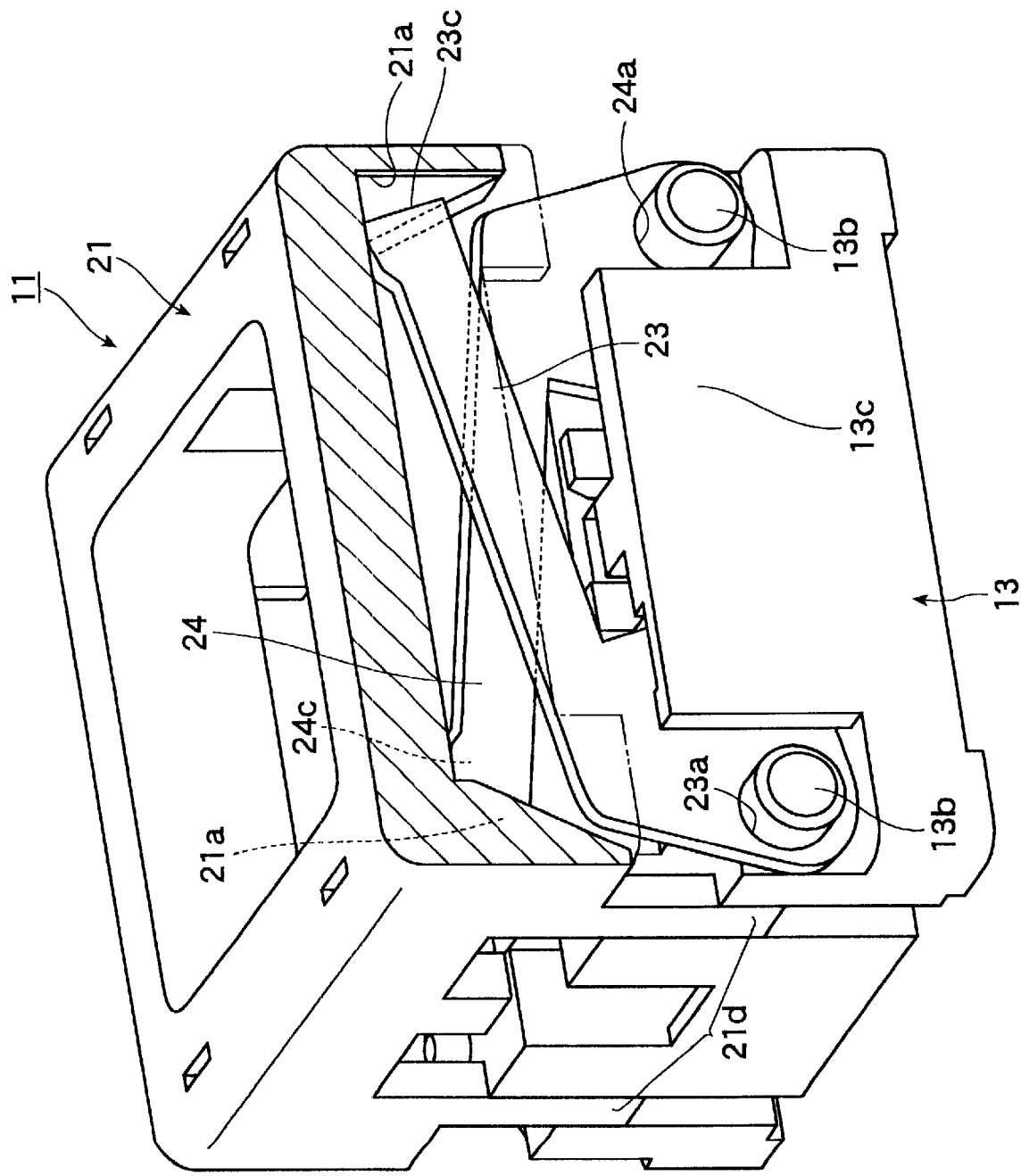
FIG. 4 is a perspective view, partially in section, of the IC socket of the above embodiment.

Moreover, front end portions 23c and 24c of the first and second levers 23 and 24 are inserted into guide grooves 21a formed to the rear surface of the operation member 21, as shown in FIG. 4, to thereby guide the front end portions 23c and 24c and prevent them from coming off sideways.

According to the described structures, when the operation member 21 is moved downward, both the lever members 23 and 24 are rotated, through which the movable member 17 is also lowered.

Then, with reference to FIGS. 10 and 11, the movable member 17 has cam portions 17a each disposed to adjacent two contact pins 15, and the cam portion 17a is, at its both sides, with sliding surfaces 17b. These sliding surfaces 17 press the bent portions 15g of the elastic pieces 15a, 15b of the contact pins 15 which contact the sliding surfaces 17b of both the side portions of the cam portion 17a. That is, one cam portion 17a presses both the bent portions 15g of the elastic pieces 15a, 15b of the contact pins 15 each disposed to each of both sides of the cam portion 17a, and hence, the bent portions 15g of the paired elastic pieces 15a, 15b of one contact pin 15 are pressed by a pair of cam portions 17a disposed both sides of this one contact pin 15 in a direction approaching each other, thus the contact portions 15e and 15f being opened (separated from each other).

On the other hand, as shown in FIGS. 10 to 16, the top plate 19 has the mount surface portion 19a on which the IC package 12 is mounted and is provided with positioning ribs 19c, as shown in FIG. 10, each to be inserted into a space between the paired contact portions 15e and 15f of the contact pin 15. The positioning rib 19c takes a state clamped between both the elastic pieces 15a and 15b in the closed state (i.e. a state that no external force is applied to the elastic pieces) of both the contact portions.

Figure 13:
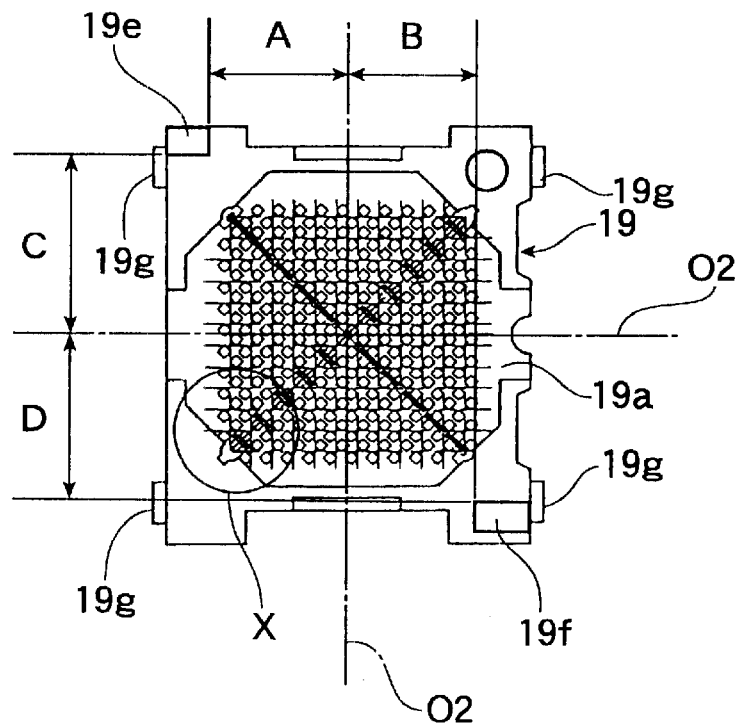
FIG. 13 is a plan view of a top plate of the IC socket of this embodiment.
Figure 14:
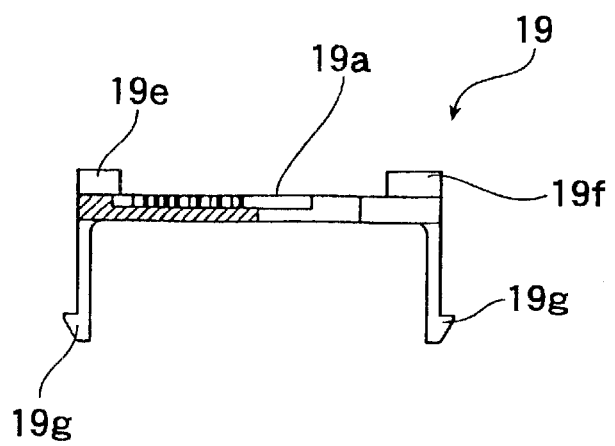
FIG. 14 is a front view of the top plate having a left half in section.
Figure 15:
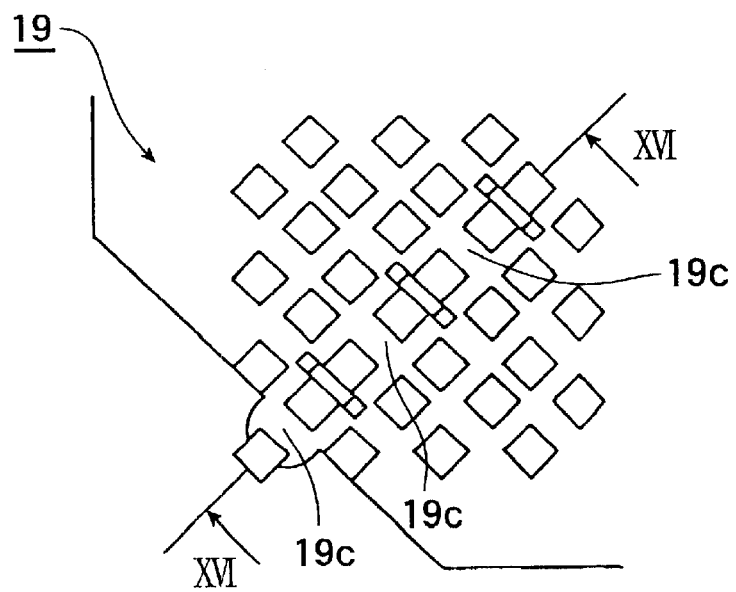
FIG. 15 is an enlarged view of a portion X in FIG. 13.
Figure 16:
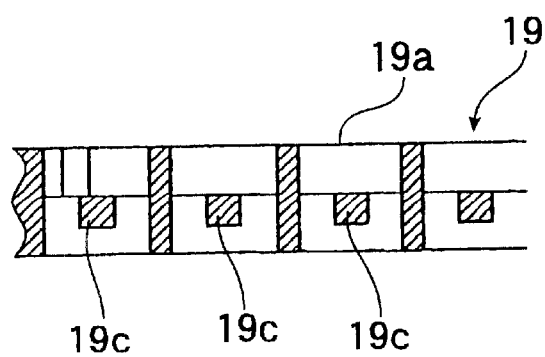
FIG. 16 is a sectional view taken along the line XVI—XVI of FIG. 15.

Furthermore, the top plate 19 is provided with hook pieces 19g, as shown in FIG. 14, through which the top plate 19 is itself mounted to the socket body 13. Further, the top plate 19 is also provided with first and second assembling projections 19e and 19f to which the guide member 20 is fitted. As shown in FIG. 13, these assembling projections 19e and 19f are arranged to portions not symmetric with respect to center lines of whole the IC socket 11 (called as socket center line(s) O2), i.e. A>B and C>D, and as also shown in FIG. 12, center lines in X and Y directions between the first and second assembling projections 19e and 19f (called as assembling projection center line(s) O3) are set at positions apart from predetermined distances from the socket center lines O2, respectively, i.e. a distance substantially half of an arrangement pitch of the solder ball 12b.

Figure 17:
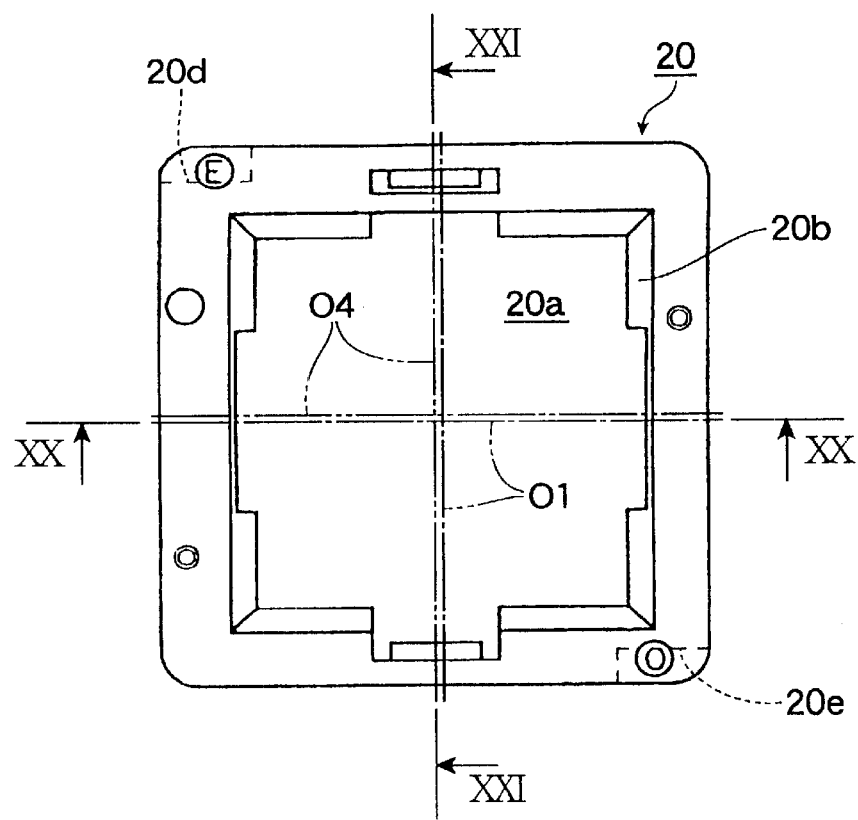
FIG. 17 is a plan view of the guide member of the IC socket of this embodiment.
Figure 18:
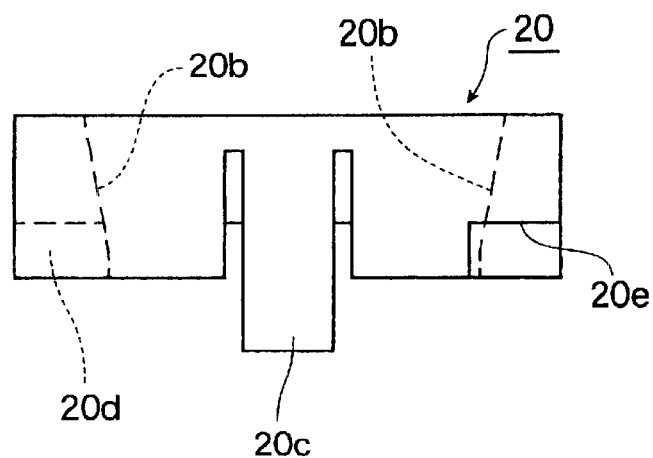
FIG. 18 is a front view of the guide member of the IC socket of this embodiment.
Figure 19:
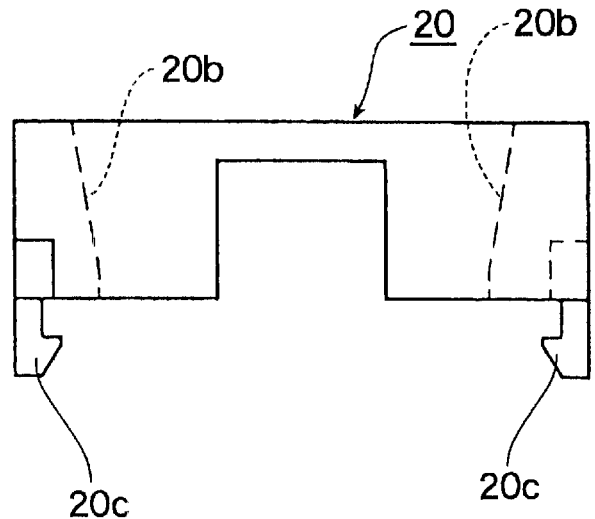
FIG. 19 is a right side view of the guide member of the IC socket of this embodiment.
Figure 20:
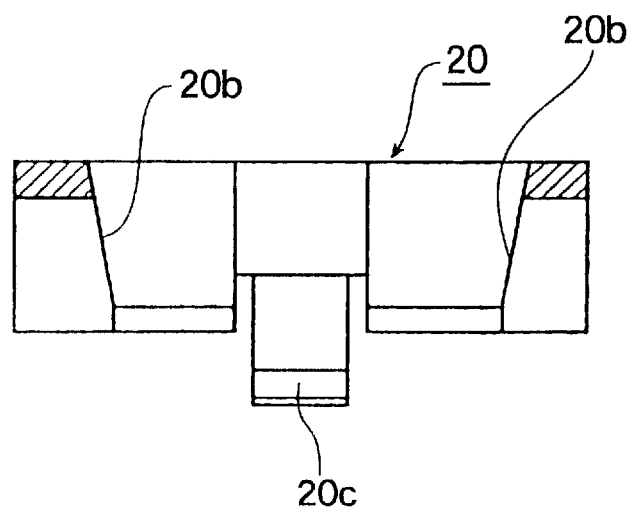
FIG. 20 is a sectional view taken along the line XX—XX in FIG. 17.
Figure 21:
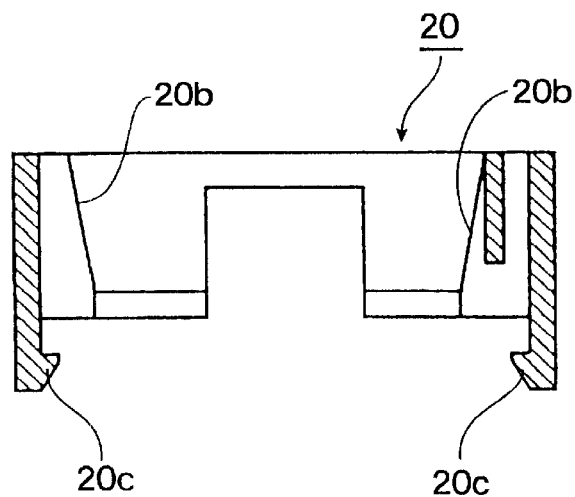
FIG. 21 is a sectional view taken along the line XXI—XXI in FIG. 17.

Furthermore, the guide member 20 has a square shape as shown in FIGS. 17 to 24 and is provided with an accommodation portion 20a having a square shape at a portion inside the guide member. As shown in FIG. 17, center lines of this square accommodation space 20a (called as guide accommodation space center line(s) O1) are set at positions apart from predetermined distances from center lines of an outer appearance of the guide member 20 (called as guide member outer appearance center line(s) O4), i.e. a distance substantially half of an arrangement pitch of the solder ball 12b.

Still furthermore, the guide member 20 is formed with tapered portions 20b along which the IC package 12 is guided and set in the accommodation space 20a thereof. The guide member 20 is further provided with a hook portion 20c to be engaged with an engagement portion 19d of the top plate 19 as shown in FIG. 3.

Figure 12:
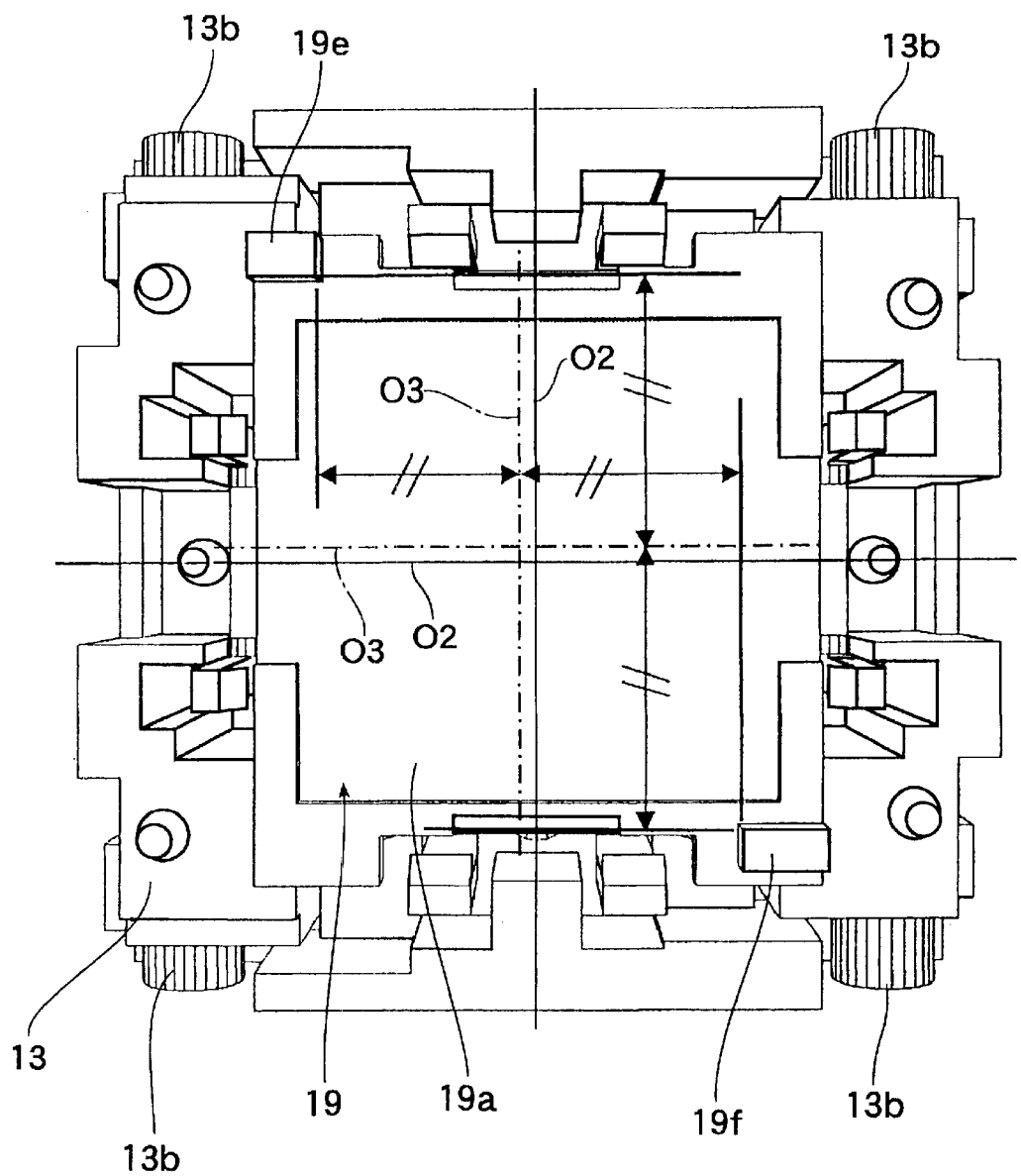
FIG. 12 is a perspective view of the IC socket of this embodiment with the operation member and guide member being removed.

Still furthermore, first and second fitting recesses 20d and 20e are formed to the bottom portion of the guide member 20, and the first and second assembling projections 19e and 19f shown in FIGS. 12 and 13 are fitted and mounted to these recesses 20d and 20e, respectively.

The guide member 20 of the structures mentioned above can be mounted to a first mount position (FIG. 22) and a second mount position (FIG. 23) which are different by 180° in their assembling positions. That is, in the first mount position, the first assembling projection 19e is fitted to the first recess 20d and the second assembling projection 19f is fitted to the second recess 20e, and in the second mount position, the first assembling projection 19e is fitted to the second recess 20e and the second assembling projection 19f is fitted to the first recess 20d.

As mentioned above, by changing the assembling position of the guide member 20 substantially by 180° in angular position, the position of the accommodation space 20a can be changed with respect to the arrangement region P of the contact pins on the side of the socket body 13, and accordingly, the IC packages 12 having different arrangement rows of terminals, which will be described further in detail hereinlater.

In the meantime, the operation member 21 has substantially the square frame shape as shown in FIG. 1 and an opening 21b having a size capable of inserting the IC package 12, which is inserted through this opening 21b and mounted to the predetermined position on the mount surface portion 19a of the top plate 19. This operation member 21 is arranged to be vertically movable with respect to the socket body 13 and urged upward by means of spring 27. The operation member 21 is prevented from coming off at its uppermost position (most rising position) through the engagement between the engaging member 21d in shape of claw with the engagement portion of the socket body 13.

Such operation member 21 is disposed around the guide member 20 to be vertically movable, and the operation member 21 takes substantially the same plane as that of the guide member 20 at its lowermost position (most descending position).

Still furthermore, the operation member 21 is formed with an operating portion, not shown, for rotating the latch 28. The latch 28 is mounted to the socket body 13 to be rotatable about its axis and is urged by a spring, not shown, in a direction of closing so as to press the peripheral edge portion of the IC package 12 by the press portion 28b formed to a front end portion of the latch 28.

The latch 28 is further formed with a portion to be pressed (pressed portion), not shown, on which the operating portion of the operation member 21 is slid, and when the operation member 21 is lowered, the operating portion thereof is slid on the pressed portion of the latch 28 so that the latch 28 is rotated in the clockwise direction shown with two-dot-chain line in FIG. 2 and the press portion 28b is hence retired from the setting position of the IC package 12.

According to the structure mentioned above, the IC packages including odd (odd number) grid arrangement and even (even number) grid arrangement in which the arrangement numbers of the solder balls 12b are different from each other can be utilized by changing the assembling position of the guide members in the respective arrangements of the grids, thereby reducing troublesome maintenance working without increasing the number of parts or elements.

Figure 22:
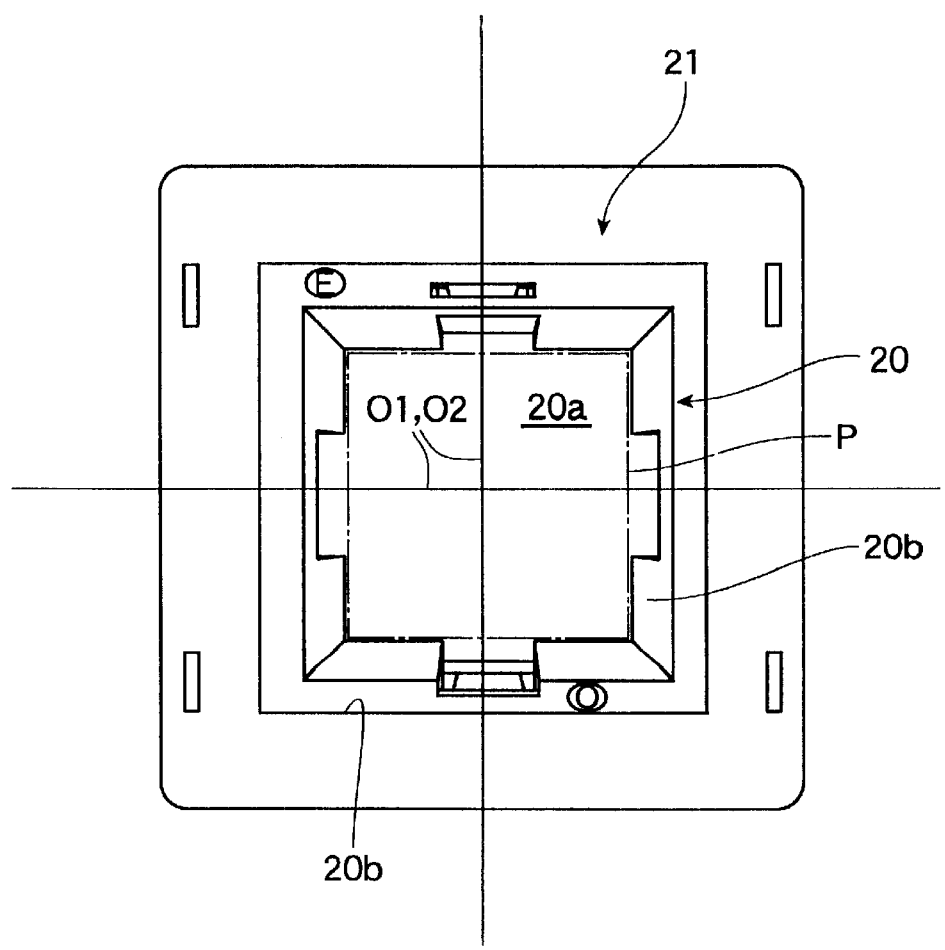
FIG. 22 is a plan view showing the operation member and the guide member of the IC socket of this embodiment.
Figure 23:
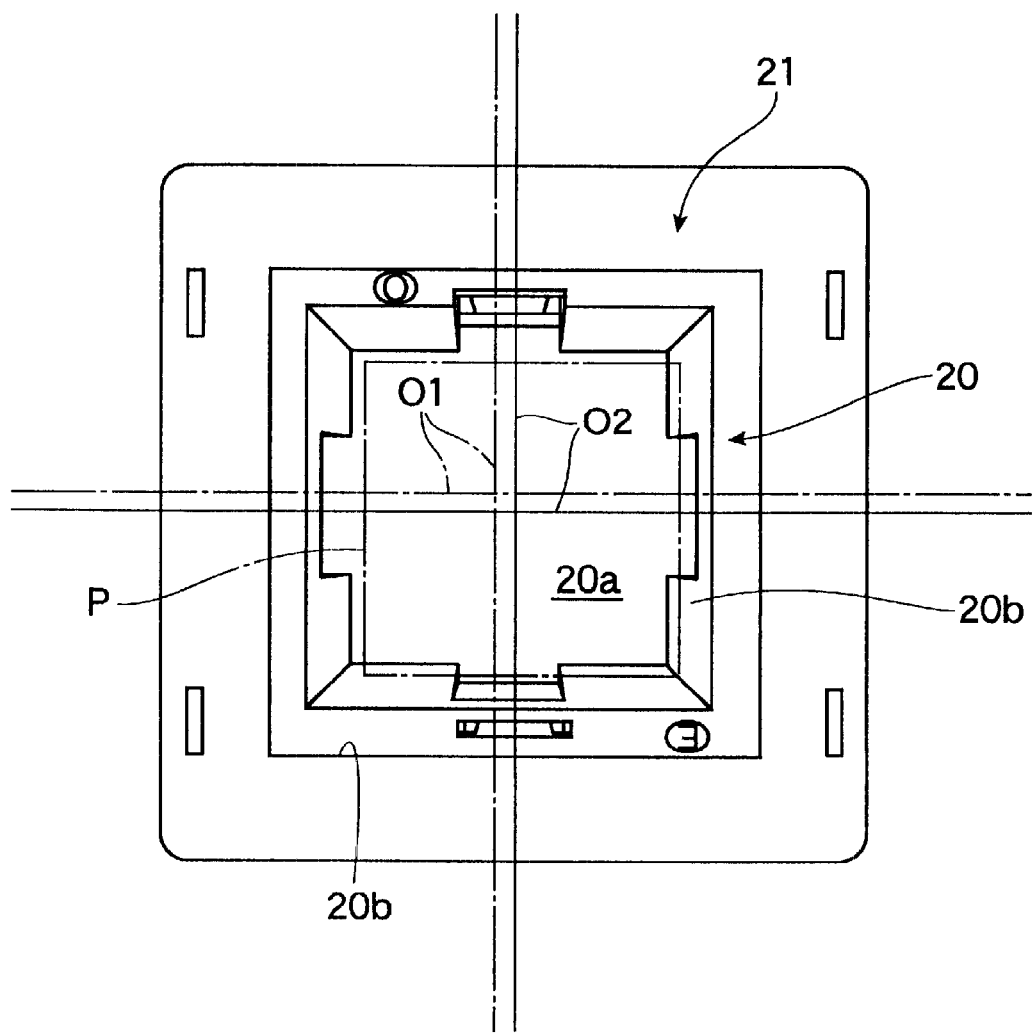
FIG. 23 is a plan view showing a state that the guide member is rotated by 180° from the state shown in FIG. 22 to a position inside the operation member.

That is, the state shown in FIG. 22 corresponds to the even grid arrangement of the number of the solder balls 12b, and in this state, the guide accommodation space center lines O1 accord with the socket center lines O2. From this state, by rotating the arrangement (direction) of the guide member 20 by 180° so as to reverse the positional relationship between the letters "E" and "O" of the guide member 20 as shown in FIG. 23, the guide member 20 becomes usable for the even grid arrangement of the solder balls 12b.

Figure 24:
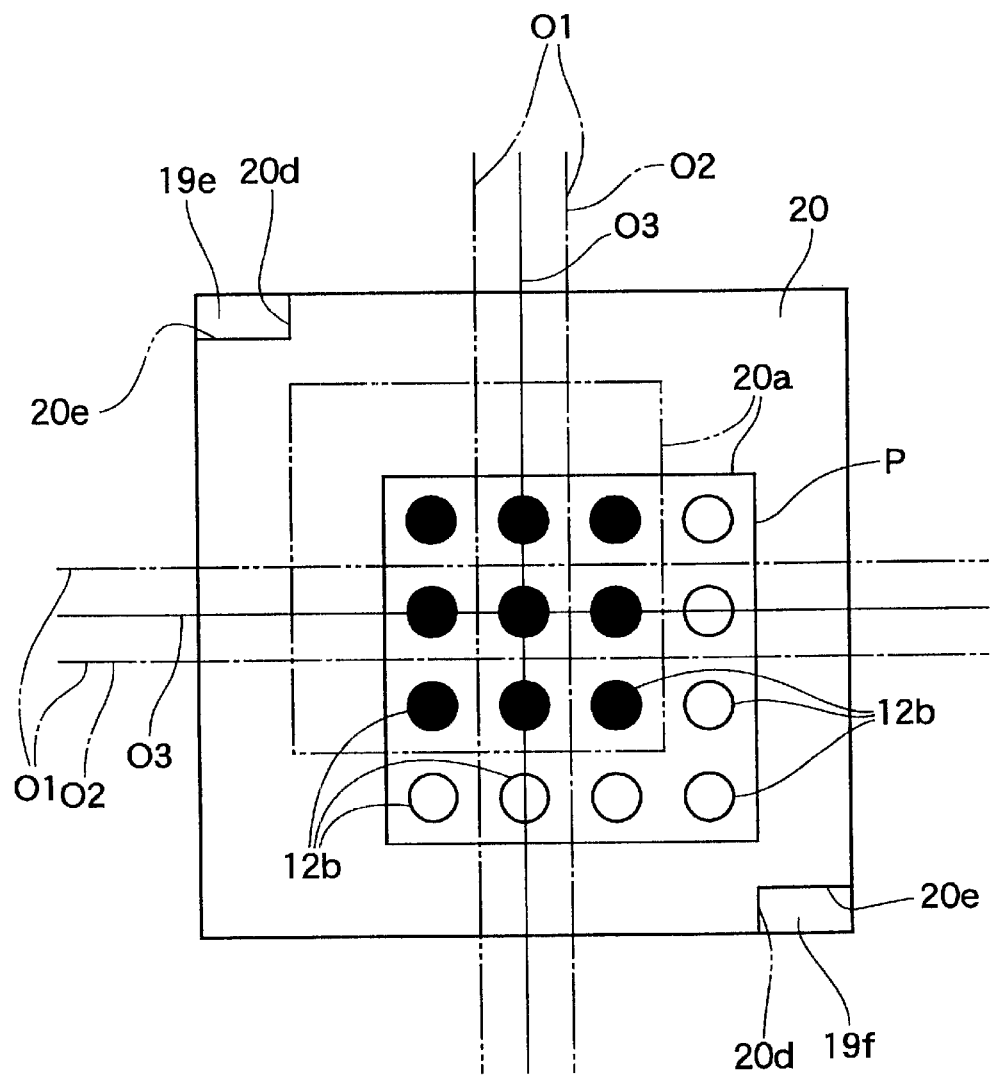
FIG. 24 is a view utilized for the explanation of functions of the IC socket of the present invention.

This will be explained more easily with reference to FIG. 24 in which the number of the solder balls 12b is extremely reduced. With reference to FIG. 24, the first assembling (setting) position corresponds to the IC package 12 having even grid arrangement of four vertical and horizontal rows of solder balls 12b. That is, in the first assembling position, the accommodation space 20a of the guide portion 20 is positioned as shown with solid line in FIG. 24, and in this state, the socket center lines O2 accord with the guide accommodation center lines O1, in which sixteen contact pins 15 are positioned in the accommodation space 20a, to which the solder balls 12b are contacted respectively.

In the second assembling (setting) position in which the guide member 20 is rotated, from the first assembling position, by 180° with the guide member 20 being removed from the top plate 19, the position of the contour line of the guide member 20 is not changed, but the position of the accommodation space 20a is displaced from the position shown with solid line to a position shown with two-dot-chain line.

In such case, the guide accommodation space center lines O1 are shifted (displaced) each by one pitch of the solder ball 12b with the assembling projection center lines O3 being the center of the shifting from the state shown with one-dot-chain line in FIG. 24 to the state shown with two-dot-chain line in FIG. 24. This state corresponds to the IC package 12 having odd grid arrangement of three vertical and horizontal rows of solder balls 12b, which are accommodated in the accommodation space 20a of the guide portion 20 as shown with two-dot-chain line in FIG. 24.

Thus, as mentioned above, according to the described embodiment of the present invention, the IC packages 12 having different solder ball row arrangements can be handled by using the same guide member 20.

Figure 6:
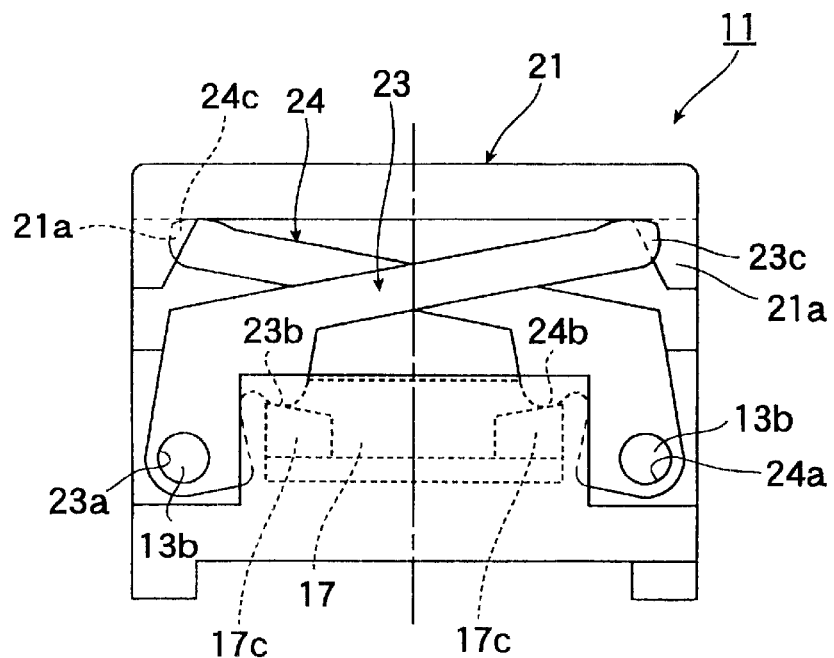
FIG. 6 is a front view of the IC socket in a state of the operation member moved up to its uppermost position.
Figure 7:
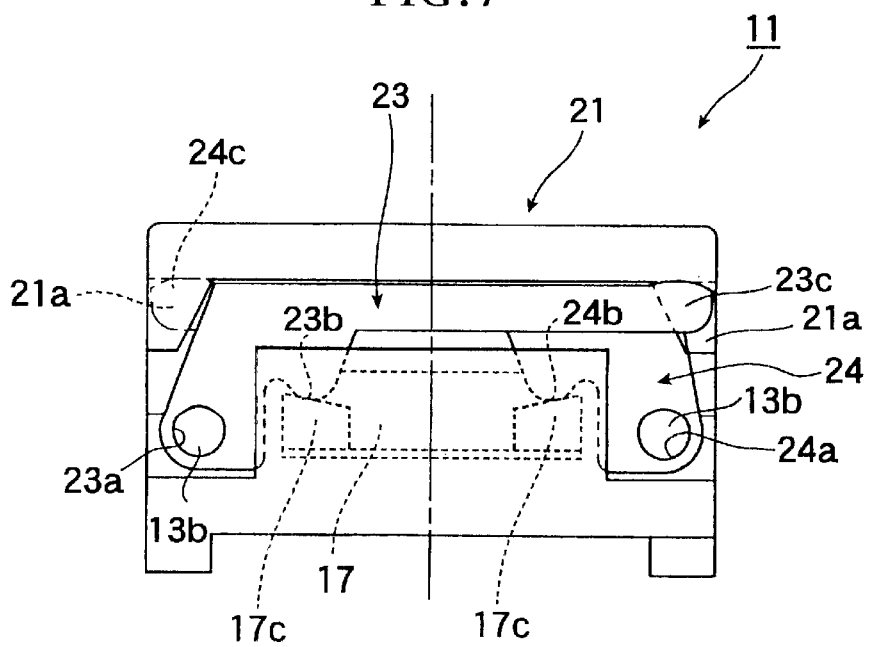
FIG. 7 is a front view of the IC socket in a state of the operation member moved down to its lowermost position.

Hereunder, the usage of the IC socket of the structure mentioned above will be described. At a time when the IC package 12 is set to the IC socket 11, the operation member 21 is first depressed downward. Then, the front end portions 23c and 24c of the lever members 23 and 24 are pressed downward and thereby rotated downward from the state shown in FIG. 6 to the state shown in FIG. 7 with the boss 13b of the socket body 13 being the center of the rotation. Accordingly, the movable member 17 is pressed by the press portions 23b and 24b of the respective lever members 23 and 24 and then moved downward against the urging force of the spring 27 shown in FIG. 3. According to this lowering motion of the movable member 17, the cam portions 17a are also lowered as shown in FIGS. 10 and 11, and both the bent portions 15g of the elastic pieces of the contact pins 15 are pressed by the sliding surfaces 17b of the cam portions 17a, thus the paired contact portions 15e and 15f being opened as shown in FIG. 11.

At the same time, the portion (to be pressed) of the latch 28 is pressed by the operating portion of the operation member 21 to be thereby rotated from the solid line position to the two-dot-chain line position in FIG. 2 against the urging force of the spring in the opening direction thereof, and thus, the pressing portion 28b of the latch 28 is displaced to the retiring position.

Under the state mentioned above, the IC package 12 is released from an automatic machine and guided to the accommodation space 20a by the tapered portion 20b of the guide member 20, thus being set of the predetermined position. In this state, the respective solder balls 12b of the IC package 12 are inserted, in non-contact state, in the opened interval between the paired contact portions 15e and 15f of the contact pins 15, respectively, as shown in FIG. 11B.

Thereafter, when the downward pressing force to the operation member 21 is released, the operation member 21 is moved upward by the urging force of the spring 27 and so on, and the movable member 17 is also moved upward. Simultaneously, the latch 28 is rotated in the direction for closing the latch 28 by the urging force of the spring.

Next, when the movable member 17 is moved upward, the pressing force of the cam portions 17a to the bent portions 15g of the contact pins 15 are released, and the paired contact portions 15e and 15f are moved to their closing direction from the state shown in FIG. 11 to thereby clamp the solder ball 12b therebetween.

According to the operation mentioned above, the solder balls 12b of the IC package 12 and the printed circuit board are electrically connected through the contact pins 15.

On the other hand, at the time when the IC package 12 is dismounted from the IC socket 11, the operation member 21 is lowered, the contact portions 15e and 15f are separated from the solder ball 12b, and accordingly, the IC package 12 can be easily removed with a force smaller than that required for pulling out each of the solder balls 12b from the state clamped by the paired contact portions 15e and 15f.

Further, it is to be noted that the present invention is not limited to the described embodiment and many other changes, modifications and alternations may be made without departing from the scopes of the appended claims.

That is, in the embodiment described above, although the present invention is applied to the IC socket 11 as "socket for electrical parts", the present invention is not limited to such an IC socket and is applicable to other devices or like. Moreover, the present invention is applied to the IC socket for the BGA type IC package 12, but it is not limited thereto and applicable to an IC socket for an LGA (Land Grid Array) type IC package. Furthermore, in the described embodiment, although the present invention is applied to a so-called open-top-type IC socket, the present invention is not limited to such type and is applicable to a so-called clamshell-type IC socket having a pivotal lid pressing the IC package.

What is claimed is:

1. A socket for electrical parts, comprising:

a socket body having a first and a second assembling portions, which accommodates an electrical part having a plurality of terminals, where the first and the second assembling portions are arranged so that an assembling portion center line between the first and the second assembling portions in an X direction and a Y direction are offset, by a predetermined distance, from a contact pin center line in an X direction and a Y direction in an arrangement region of the socket body;

a plurality of contact pins arranged in the socket body so as to match an arrangement of the plurality of terminals of the electrical part;

an operation member that is vertically movable in relation to the socket body in an installed state;

a movable member that is movable in association with the movement of the operation member to thereby displace the contact pins and to contact or separate the contact pins from the terminals of the electrical part; and a guide member that guides a peripheral edge portion of the electrical part to a predetermined position in the socket body, the guide member being formed with an accommodation space into which the electrical part is guided and accommodated, the guide member having a first and a second mounting portion that relates to the first and the second assembling portions of the socket body, wherein the position of the accommodation space with respect to the arrangement region of the contact pins is changed by rotating the combination of the first and the second mounting portions in relation to the first and the second assembling portions by substantially 180°.

2. A socket for electrical parts according to claim 1, wherein said guide member is mounted to the socket body through a top plate having a mount surface on which the electrical part is mounted.

3. A socket for electrical parts in which a number of contact pins contacting a number of terminals of an electrical part are arranged in grid shape to a socket body in which the electrical part is accommodated, comprising:

a guide member that guides a peripheral edge portion of the electrical part to a predetermined position, having a first and a second assembling portions arranged in a manner that a guide member center line between the first and the second assembling portions in an X direction and a Y direction is offset, by a predetermined distance, from a contact pin center line in an X direction and a Y direction in an arrangement region of the socket body, and an accommodation space into which the electrical part is guided and accommodated that has a first and a second mounting portions which mount on the first and the second assembling portions of the socket body, wherein the position of the accommodation space with respect to the arrangement region of the contact pins is changed by rotating the combination of the first and the second mounting portions in relation to the first and the second assembling portions by substantially 180°.

4. A socket for electrical parts according to claim 3, wherein the socket body has a top plate and the guide member is mounted to the top plate of the socket body on which the electrical part is mounted.

5. A socket for electrical parts according to claim 3, wherein said terminals of the electrical part are solder balls.

6. A socket for electrical part according to claim 3, wherein said socket is an IC socket and said electrical part is an IC package.

7. A socket for electrical part according to claim 3, wherein the center line offset is half a pitch of adjacent terminals of the electrical part in plan view.

8. A socket for electrical parts according to claim 3, wherein the socket body is further provided with an operation member to be vertically movable in an installed state and a movable member for displacing the contact pins in a manner that the movable member is moved through the vertical movement of the operation member and the contact pins are displaced through the movement of the movable member so as to be contacted to or separated from terminals of the electrical part.

9. A socket for electrical parts according to claim 8, wherein said guide member has a rectangular frame structure, said operation member has a rectangular frame structure, and said operation member is arranged to be vertically movable around the guide member.

* * * * *

UNITED STATES PATENT AND TRADEMARK OFFICE
CERTIFICATE OF CORRECTION

PATENT NO.    : 6,439,910 B2
DATED         : August 27, 2002
INVENTOR(S)   : Kenji Hayakawa It is certified that error appears in the above-identified patent and that said Letters Patent is hereby corrected as shown below:

<u>Title page,</u>
Item [57], ABSTRACT,
Line 5, change "prcdctcrmincd" to -- predetermined --.

<u>Column 9,</u>
Line 16, change "asscmbling" to -- assembling -- and change "arc" to -- are --.
Line 29, change "movcment" to -- movement --, change "thc" to -- the --; change "opcration" to -- operation --, change "membcr" to -- member --, change "thcrcby" to -- thereby -- and change "displacc" to -- displace --.

<u>Column 10,</u>
Line 30, change "whcrcin" to -- wherein --; change "sockct" to -- socket -- (both occurrences); and change "clectrical" to -- electrical --.
Line 41, change "arc" to -- are --; change "movcmcnt" to -- movement -- and change "thc" to -- the --.

Signed and Sealed this

Eighteenth Day of February, 2003

JAMES E. ROGAN
*Director of the United States Patent and Trademark Office*